United States Patent
Lin

(10) Patent No.: US 10,469,061 B1
(45) Date of Patent: Nov. 5, 2019

(54) QUADRATURE CLOCK GENERATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/368,943

(22) Filed: Mar. 29, 2019

(51) Int. Cl.
*H03H 11/16* (2006.01)
*H03K 5/13* (2014.01)
*H03K 3/037* (2006.01)
*G06F 1/10* (2006.01)

(52) U.S. Cl.
CPC .............. *H03K 3/037* (2013.01); *G06F 1/10* (2013.01)

(58) Field of Classification Search
USPC ................................ 327/231–260, 291–298
See application file for complete search history.

(56) References Cited

U.S. PATENT DOCUMENTS

2014/0086364 A1\* 3/2014 Schell ................. H03H 7/06
375/340
2015/0070066 A1\* 3/2015 Dedic ................. G06F 1/10
327/254

\* cited by examiner

*Primary Examiner* — Anh Q Tra
(74) *Attorney, Agent, or Firm* — McClure, Qualey & Rodack, LLP

(57) ABSTRACT

A method including operations of receiving an input clock at an input node, coupling the input node to a first internal node using a first capacitor, inverting a first internal signal at the first internal node into a first interim signal at a first interim node using a first inverter, coupling the first interim node to the first internal node using a first resistor, coupling the input node to a second internal node using a second resistor, inverting a second internal signal at the second internal node into a second interim signal at a second interim node using a second inverter, coupling the second interim node to the second internal node using a second capacitor, and using a buffer to receive the first interim signal and the second interim signal and output a first phase and a second phase of an output clock.

6 Claims, 5 Drawing Sheets

QUADRATURE CLOCK GENERATOR AND METHOD THEREOF

BACKGROUND OF THE DISCLOSURE

Field of the Invention

The present invention generally relates to quadrature clock generation, and more particularly to circuits and methods for generation of a quadrature clock from a two-phase clock without using filters.

Description of Related Art

As is well understood by persons skilled in the art, a clock is a voltage signal that periodically toggles back and forth between a low level and a high level. A two-phase clock is a clock having two phases that are 180 degrees out of phase. A quadrature clock is a clock having four phases, including a first phase, a second phase, a third phase, and a fourth phase, that are nominally uniformly spaced in time; that is: the first, the second, and the third phases are ahead of the second, the third, and the fourth phases by 90-degrees, respectively. A polyphase filter 100 shown in FIG. 1 can be used to generate a quadrature clock from a two-phase clock. Here, A1 and A2 are two phases of a two-phase clock; B1, B2, B3, B4 are four phases of an interim quadrature clock; and D1, D2, D3, and D4 are four phases of an output quadrature clock.

Polyphase filter 100 includes four capacitors 111, 112, 113, and 114, four resistors 121, 122, 123, and 124; and four inverters 131, 132, 133, and 134. Capacitor 111 and resistor 124 form a first high-pass filter to filter A1 into B1. Resistor 121 and capacitor 112 form a first low-pass filter to filter A1 into B2. Capacitor 113 and resistor 122 form a second high-pass filter to filter A2 into B3. Resistor 123 and capacitor 114 form a second low-pass filter to filter A2 into B4. Inverters 131, 132, 133, 134 are used as a buffer and configured to receive B1, B2, B3, and B4 and output D1, D2, D3, and D4, respectively. Polyphase filter 100 is well known and understood in the prior art and thus not explained in detail here. A drawback of polyphase filter 100 is: an amplitude of B1 is smaller than an amplitude of A1 due to a loss caused by the first high-pass filter made up of capacitor 111 and resistor 124. An amplitude of B2 is smaller than the amplitude of A1 due to the first low-pass filter made up of resistor 121 and capacitor 112. Likewise, an amplitude of B3 is smaller than an amplitude of A2, and an amplitude of B4 is smaller the amplitude of A2. Smaller amplitudes, as those identified above, lead to a loss in signal-to-noise ratio.

What is desired is a circuit that can generate a quadrature clock from a two-phase clock without using filters that attenuate the two-phase clock and inevitably degrade a signal-to-noise ratio.

BRIEF SUMMARY OF THIS INVENTION

In an embodiment, a circuit comprises: an inverting amplifier configured to receive an input clock at an input node and output a first interim signal at a first interim node; an inverting integrator configured to receive the input clock and output a second interim signal at a second interim node; and a buffer configured to receive the first interim signal and the second interim signal and output a first phase and a second phase of an output clock, wherein the inverting amplifier comprises a first capacitor configured to couple the input node to a first internal node, a first inverter configured to receive a first internal signal at the first internal node and output the first interim signal, and a first resistor configured to couple the first interim node to the first internal node, and the inverting integrator comprises a second resistor configured to couple the input node to a second internal node, a second inverter configured to receive a second internal signal at the second internal node and output the second interim signal, and a second capacitor configured to couple the second interim node to the second internal node.

In an embodiment, a method comprises: receiving an input clock at an input node; coupling the input node to a first internal node using a first capacitor; inverting a first internal signal at the first internal node into a first interim signal at a first interim node using a first inverter; coupling the first interim node to the first internal node using a first resistor; coupling the input node to a second internal node using a second resistor; inverting a second internal signal at the second internal node into a second interim signal at a second interim node using a second inverter; coupling the second interim node to the second internal node using a second capacitor; and using a buffer to receive the first interim signal and the second interim signal and output a first phase and a second phase of an output clock.

DETAILED DESCRIPTION OF THIS DISCLOSURE

The present invention relates to quadrature clock generation. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "node (circuit node)," "power supply node," "ground," "signal," "voltage," "capacitor," "resistor," "CMOS (complementary metal oxide semiconductor)," "PMOS (P-channel metal oxide semiconductor) transistor," "NMOS (N-channel metal oxide semiconductor) transistor," "phase," "clock," "inverter," "integrator," "AC (alternate current)," "DC (direct current)," and "bandwidth." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

A logical signal is a signal of two logical states: a first logical state (or a "high" state), and a second logical state (or a "low" state). When a logical signal is said to be high (low), it means it is in the "high" ("low") state, and it occurs when the logical signal is above (below) a threshold level that is called a "trip point." Every logical signal has a trip point, and two logical signals may not necessarily have the same trip point. A clock is a periodic logical signal.

In this disclosure, a "buffer" is a circuit that receives a first logical signal and output a second logical signal, such that the second logical signal has a sharp transition between the two logical states. In other words, a logical signal output by a "buffer" can toggle rapidly between two logical states. Consequently, a clock output by a "buffer" is nearly a square wave due to having sharp transitions.

In this disclosure, a "signal" is a voltage that can vary with time.

The present disclosure is presented from an engineering perspective. For instance, "X is equal to Y" means: "a difference between X and Y is smaller than a specified engineering tolerance." "X is substantially smaller than Y" means: "a ratio between X and Y is smaller than a specified engineering tolerance."

Figure 1:
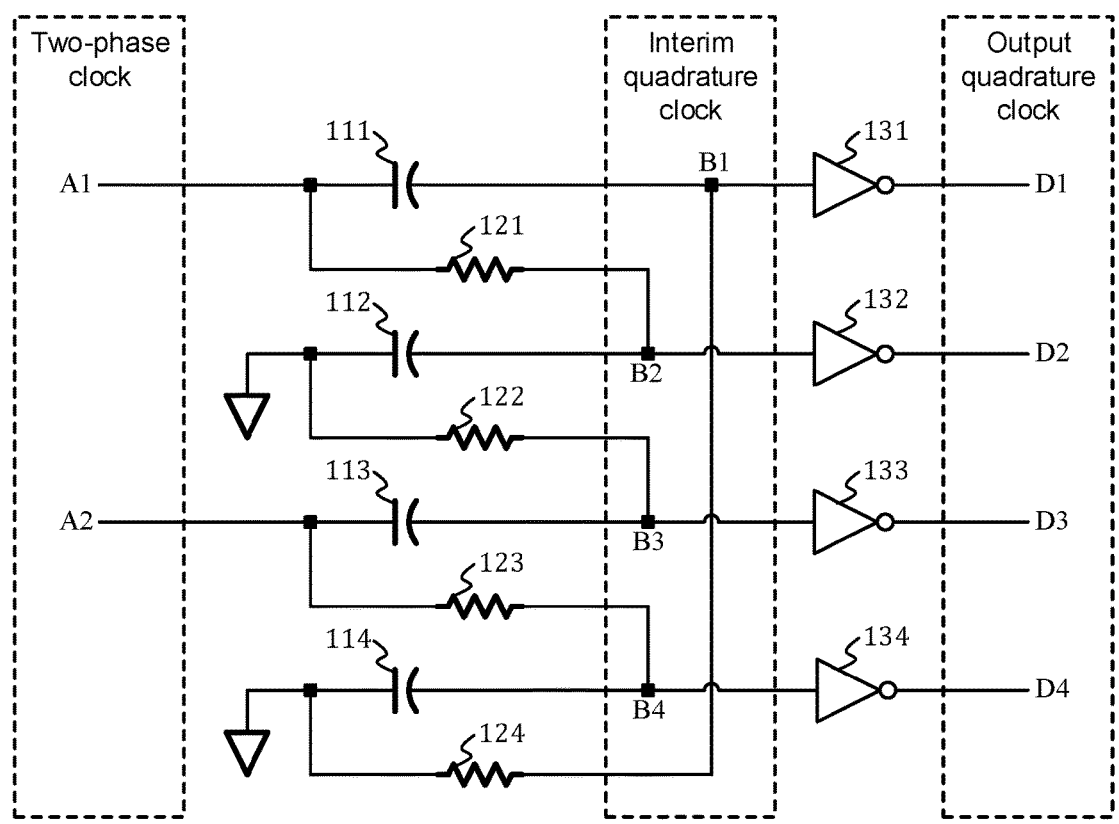
FIG. 1 shows a schematic diagram of a polyphase filter.
Figure 2:
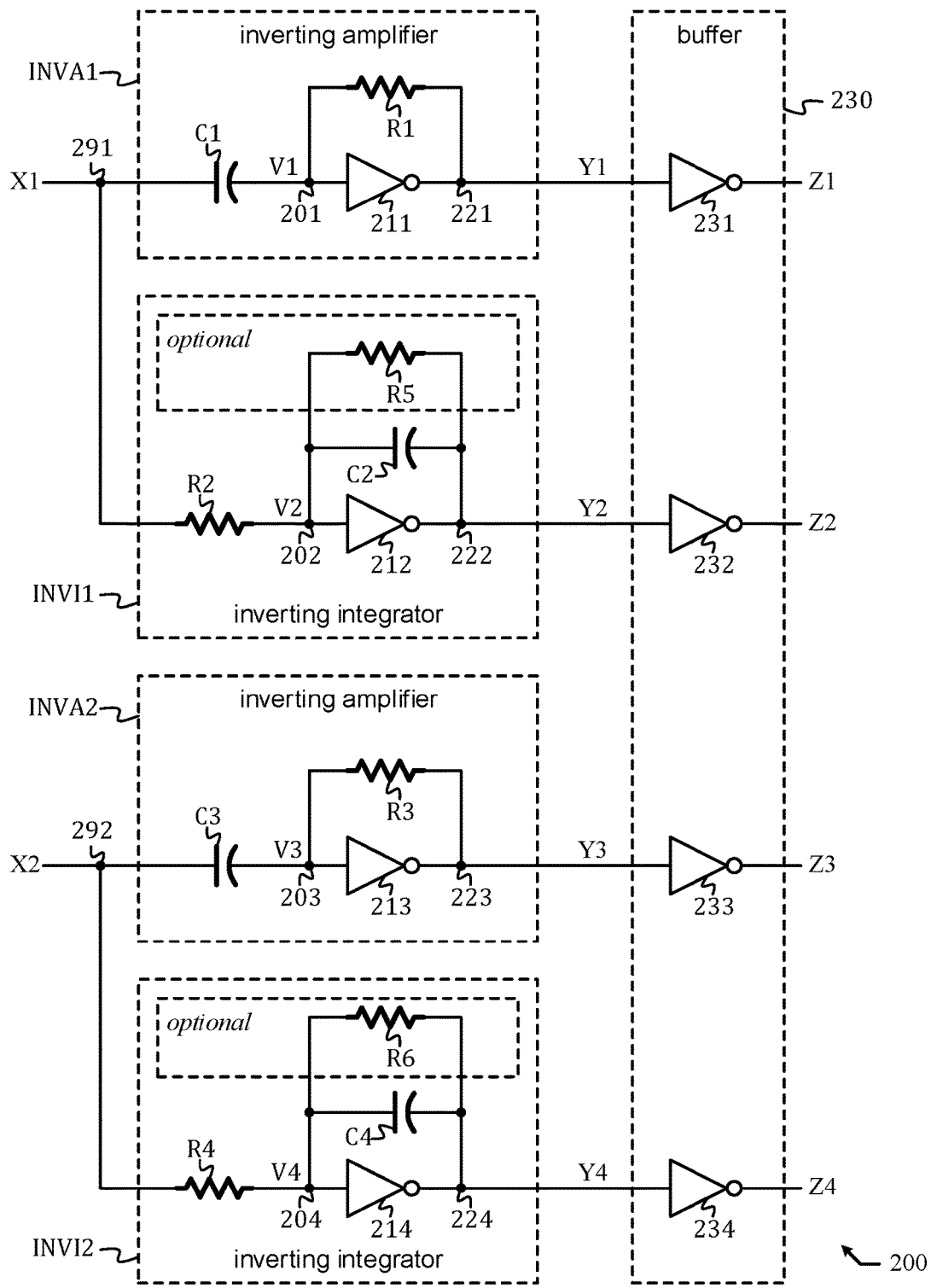
FIG. 2 shows a schematic diagram of a circuit in accordance with an embodiment of the present invention.

A schematic diagram of a circuit 200 in accordance with an embodiment of the present invention is shown in FIG. 2. Circuit 200 is configured to receive a two-phase clock comprising a first phase X1 and a second phase X2 and output a four-phase clock comprising a first phase Z1, a second phase Z2, a third phase Z3, and a fourth phase Z4. Circuit 200 comprises: a first inverting amplifier INVA1 configured to receive X1 from a first input node 291 and output a first interim signal Y1 at a first interim node 221; a first inverting integrator INVI1 configured to receive X1 from the first input node 291 and output a second interim signal Y2 at a second interim node 222; a second inverting amplifier INVA2 configured to receive X2 from a second input node 292 and output a third interim signal Y3 at a third interim node 223; a second inverting integrator INVI2 configured to receive X2 from the second input node 292 and output a fourth interim signal Y4 at a fourth interim node 224; and a buffer configured to receive Y1, Y2, Y3, and Y4 and output Z1, Z2, Z3, and Z4.

The first inverting amplifier INVA1 comprises: a first capacitor C1 configured to provide an AC (alternate current) coupling between the first input node 291 and a first internal node 201; a first inverter 211 configured to receive a first internal signal V1 at the first internal node 201 and output Y1 at the first interim node 221; and a first resistor R1 configured to couple the first interim node 221 to the first internal node 201. The first inverting integrator INVI1 comprises: a second resistor R2 configured to provide a DC (direct current) coupling between the first input node 291 and a second internal node 202; a second inverter 212 configured to receive a second internal signal V2 at the second internal node 202 and output Y2 at the second interim node 222; and a second capacitor C2 configured to couple the second interim node 222 to the second internal node 202.

The second inverting amplifier INVA2 comprises: a third capacitor C3 configured to provide an AC (alternate current) coupling between the second input node 292 and a third internal node 203; a third inverter 213 configured to receive a third internal signal V3 at the third internal node 203 and output Y3 at the third interim node 223; and a third resistor R3 configured to couple the third interim node 223 to the third internal node 203. The second inverting integrator INVI2 comprises: a fourth resistor R4 configured to provide a DC (direct current) coupling between the second input node 292 and a fourth internal node 204; a fourth inverter 214 configured to receive a fourth internal signal V4 at the fourth internal node 204 and output Y4 at the fourth interim node 224; and a fourth capacitor C4 configured to couple the fourth interim node 224 to the fourth internal node 204. Buffer 230 comprises four inverters 231, 232, 233, and 234 configured to receive Y1, Y2, Y3, and Y4 and output Z1, Z2, Z3, and Z4, respectively. In an optional embodiment, circuit 200 further comprises a fifth resistor R5 configured to couple the second interim node 222 to the second internal node 202 and a sixth resistor R6 configured to couple the fourth interim node 224 to the fourth internal node 204.

Figure 3:
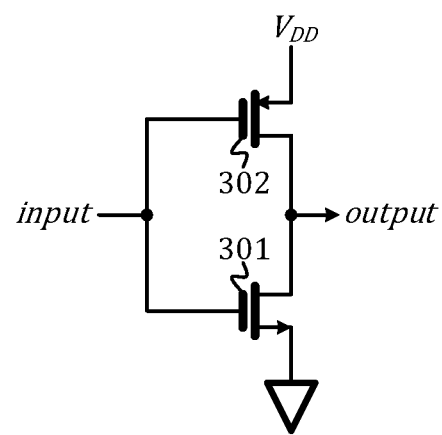
FIG. 3 shows a schematic diagram of an inverter that can be instantiated and used in the circuit of FIG. 2.

An inverter 300 that can be instantiated to embody inverters 211, 212, 213, 214, 231, 232, 233, and 234 is shown in FIG. 3. Inverter 300 comprises a NMOS (n-channel metal oxide semiconductor) transistor 301 and a PMOS (p-channel metal oxide semiconductor) transistor 302. Here, "$V_{DD}$" denotes a power supply node. Inverter 300 is well understood by those of ordinary skills in the art and does not need to be explained or described in detail here. Inverter 300 can be used as an inverting amplifier, which is also well understood and thus not described in detail here.

Reference is now made to the first inverting amplifier INVA1 in FIG. 2. Resistor R1 provides a negative feedback for inverter 211; the negative feedback can effectively extend a bandwidth of inverter 211 and make it a high-speed inverting amplifier. In addition, R1 fulfills a self-biasing function to establish a biasing point of inverter 211. Moreover, capacitor C1 is used to decouple the biasing point of inverter 211 from a DC level of X1.

Reference is now made to the first inverting integrator INVI1. Capacitor C2 provides a negative feedback for inverter 212, and resistor R2 functions as a feed-in resistor for inverter 212. An inverting amplifier (such as inverter 212) with a feed-in resistor (such as R2) and a feedback capacitor (such as C2) forms an integrator. This is well understood to those of ordinary skill in the art and thus not described in detail here.

The first inverting amplifier INVA1 causes Y1 to be approximately an inversion of X1, while the first inverting integrator INVI1 causes Y2 to be approximately an integration of an inversion of X1. Since integration leads to a 90-degree phase delay, Y2 is approximately 90-degrees behind Y1 in phase.

The second inverting amplifier INVA2 is identical with the first inverting amplifier INVA1, and the second inverting integrator INVI2 is identical with the first inverting integrator INVI1. Therefore, Y3 is approximately an inversion of X2, while Y4 is approximately an integration of an inversion of X2. Since integration leads to a 90-degree phase delay, Y4 is approximately 90-degrees behind Y3 in phase.

X2 is 180-degrees behind X1, therefore Y3 is approximately 90-degrees behind Y2. Hence, Y1, Y2, Y3, and Y4 are approximately 90-degrees apart.

Generated from either amplifier or integrator, Y1, Y2, Y3, and Y4 are not square waves that are desired for a clock signal. To address this issue, buffer 230 is used to fulfill a "square-up" function. Buffer 230 comprises inverters 231, 232, 233, and 234 that convert Y1, Y2, Y3, and Y4 into Z1, Z2, Z3, and Z4, respectively, that are square waves by forcing sharp transitions. A relative phase among Z1, Z2, Z3, and Z4, however, is approximately the same as a relative phase among Y1, Y2, Y3, and Y4, since an inverter simply introduces a 180-degree phase shift plus a finite circuit delay. Hence, Z1, Z2, Z3, and Z4 are approximately 90-degree apart.

R5 and R6 are used to provide self-biasing for inverters 212 and 214, respectively; they are not needed if the DC levels of X1 and X2 are already near the trip points of inverters 212 and 214.

Figure 4:
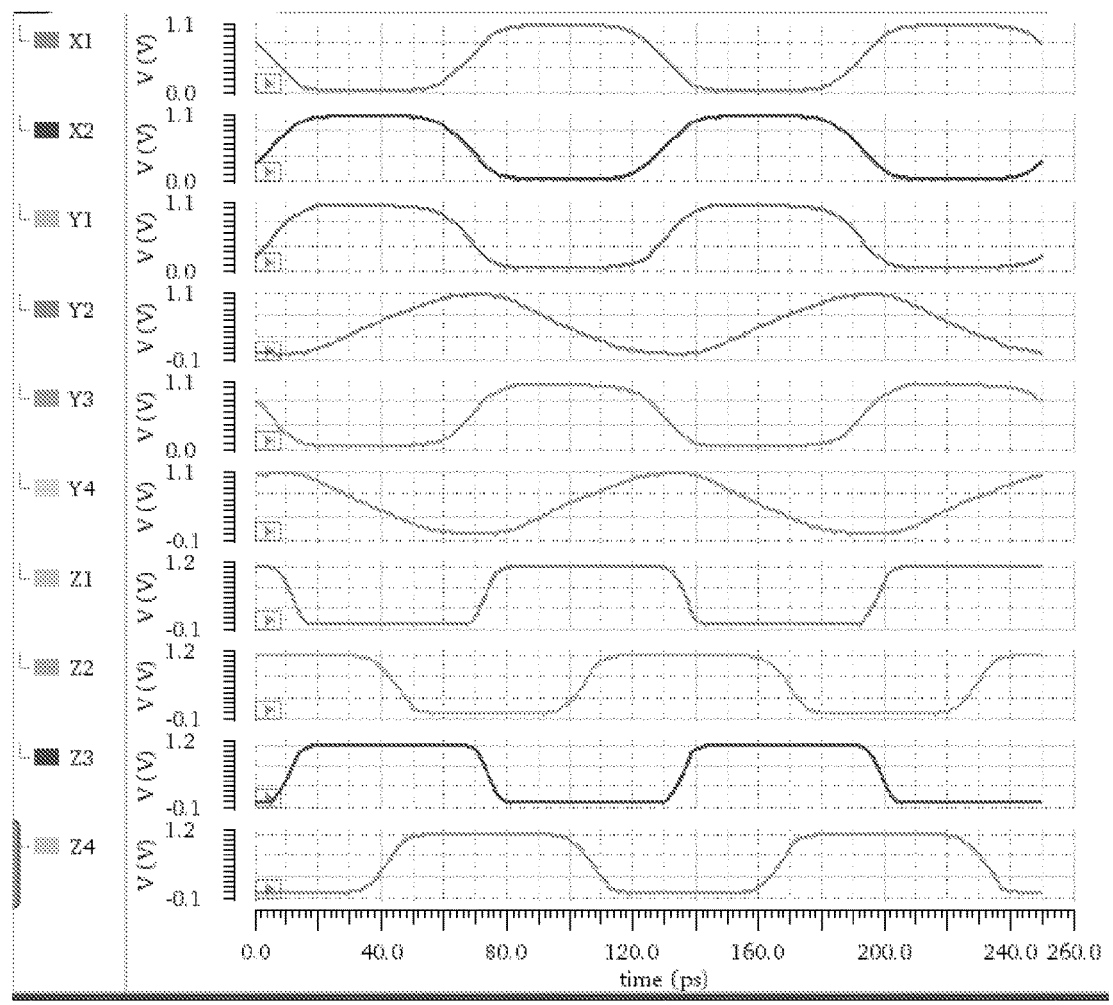
FIG. 4 shows a simulation result of the circuit of FIG. 2.

By way of example but not limitation: circuit 200 is preferably fabricated on a 28 nm CMOS (complementary metal oxide semiconductor) process; C1 and C3 are both 18 fF; R1 and R3 are both 3.5 KOhm; R2 and R4 are both 1.5 KOhm; C2 and C4 are both 6 fF; X1 and X2 are a two-phase 8 GHz clock; $V_{DD}$ is 1.1V; when instantiating inverter 300 to embody inverters 211, 212, 213, and 214, the width and length of NMOS transistor 301 are 2.4 µm and 30 nm, respectively, and the width and length of PMOS transistor 302 are 3.12 µm and 30 nm, respectively; when instantiating inverter 300 to embody inverters 231, 232, 233, and 234, the width and length of NMOS transistor 301 are 2 µm and 30 nm, respectively, and the width and length of PMOS transistor 302 are 2.6 µm and 30 nm, respectively; DC levels of X1 and X2 are both approximately 0.55V; and R5 and R6 are not used. A simulation result is shown in FIG. 4. It is clear that: X1 and X2 form a two-phase clock; Y1 is approximately an inversion of X1; Y2 is approximately an integration of an inversion of X1; Y3 is approximately an inversion of X2; Y4 is approximately an integration of an inversion of X2; and Z1, Z2, Z3, and Z4 are approximately equally spaced in time to form a four-phase clock.

Although in FIG. 2, a two-phase input clock (comprising X1 and X2) is received and a four-phase output clock (comprising Z1, Z2, Z3, Z4) is generated, in some applications a single-phase input clock is received, and a two-phase quadrature clock is needed; in this case, the second inverting amplifier INVA2, the second inverting integrator INVI2, inverter 233, and inverter 234 can be removed.

Figure 5:
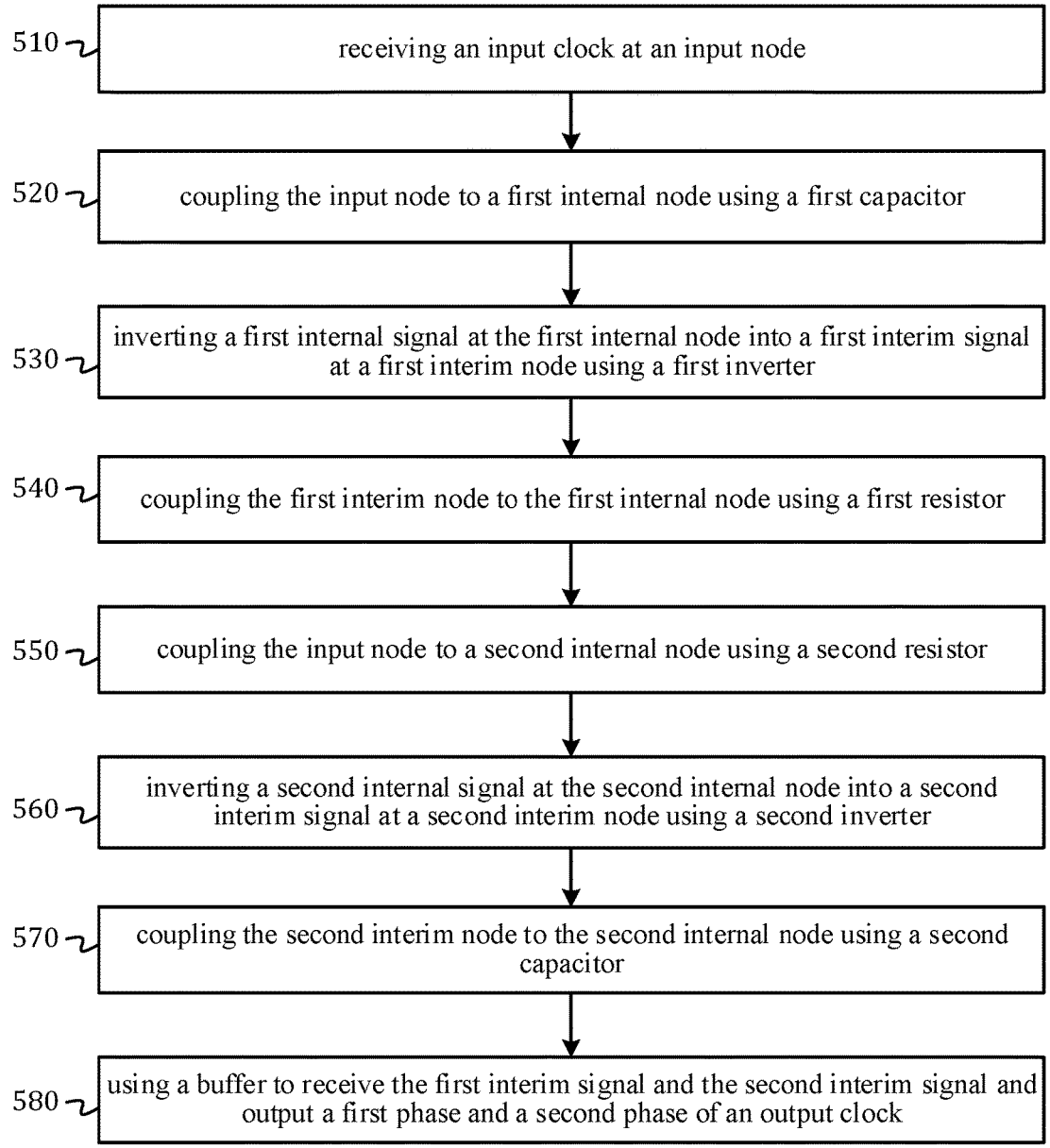
FIG. 5 shows a flow diagram of a method in accordance with an embodiment of the present disclosure.

As illustrated by a flow diagram 500 shown in FIG. 5, a method in accordance with an embodiment of the present invention comprises: (step 510) receiving an input clock at an input node; (step 520) coupling the input node to a first internal node using a first capacitor; (step 530) inverting a first internal signal at the first internal node into a first interim signal at a first interim node using a first inverter; (step 540) coupling the first interim node to the first internal node using a first resistor; (step 550) coupling the input node to a second internal node using a second resistor; (step 560) inverting a second internal signal at the second internal node into a second interim signal at a second interim node using a second inverter; (step 570) coupling the second interim node to the second internal node using a second capacitor; and (step 580) using a buffer to receive the first interim signal and the second interim signal and output a first phase and a second phase of an output clock.

Those skilled in the art will readily observe that numerous modifications and alterations of the device and method may be made while retaining the teachings of the invention. Accordingly, the above disclosure should not be construed as limited only by the metes and bounds of the appended claims.

What is claimed is:

1. A circuit comprising:
   an inverting amplifier configured to receive an input clock at an input node and output a first interim signal at a first interim node;
   an inverting integrator configured to receive the input clock and output a second interim signal at a second interim node; and
   and a buffer configured to receive the first interim signal and the second interim signal and output a first phase and a second phase of an output clock, wherein the inverting amplifier comprises a first capacitor configured to couple the input node to a first internal node, a first inverter configured to receive a first internal signal at the first internal node and output the first interim signal, and a first resistor configured to couple the first interim node to the first internal node, and the inverting integrator comprises a second resistor configured to couple the input node to a second internal node, a second inverter configured to receive a second internal signal at the second internal node and output the second interim signal, and a second capacitor configured to couple the second interim node to the second internal node.

2. The circuit of claim 1 further comprises a third resistor configured to couple the second interim node to the second internal node.

3. The circuit of claim 1, wherein the buffer comprises a third inverter configured to receive the first interim signal and output the first phase of the output clock, and a fourth inverter configured to receive the second interim signal and output the second phase of the output clock.

4. A method comprising:
   receiving an input clock at an input node;
   coupling the input node to a first internal node using a first capacitor;
   inverting a first internal signal at the first internal node into a first interim signal at a first interim node using a first inverter;
   coupling the first interim node to the first internal node using a first resistor;
   coupling the input node to a second internal node using a second resistor;
   inverting a second internal signal at the second internal node into a second interim signal at a second interim node using a second inverter;
   coupling the second interim node to the second internal node using a second capacitor; and
   using a buffer to receive the first interim signal and the second interim signal and output a first phase and a second phase of an output clock.

5. The method of claim 4 further comprising coupling the second interim node to the second internal node using a third resistor.

6. The method of claim 5, wherein the buffer comprises a third inverter configured to receive the first interim signal and output the first phase of the output clock, and a fourth inverter configured to receive the second interim signal and output the second phase of the output clock.

* * * * *